United States Patent [19]

Kurafuji

[11] 4,400,800
[45] Aug. 23, 1983

[54] SEMICONDUCTOR RAM DEVICE

[75] Inventor: Setsuo Kurafuji, Yokohama, Japan

[73] Assignee: Fujitsu Limited, Kawasaki, Japan

[21] Appl. No.: 210,663

[22] Filed: Nov. 26, 1980

[30] Foreign Application Priority Data

Nov. 29, 1979 [JP] Japan .................. 54-154578

[51] Int. Cl.³ ............................. G11C 11/40
[52] U.S. Cl. .................... 365/190; 365/205
[58] Field of Search ........... 365/154, 189, 190, 205, 365/207; 307/DIG. 3

[56] References Cited

U.S. PATENT DOCUMENTS 4,125,878 11/1978 Watanabe ............... 365/205 X
4,255,678 3/1981 Suzuki et al. ........... 365/205 X Primary Examiner—Joseph A. Popek
Attorney, Agent, or Firm—Staas & Halsey

[57] ABSTRACT

A static type semiconductor RAM device comprising a latch circuit at every column which detects, amplifies and temporarily memorizes a read-out signal from each of the memory cells in the corresponding column and which has a large drive capacity. In the static type RAM device according to the present invention, each of the memory cells is used as an element which only holds information, and data bus lines are driven by the latch circuits having a large drive capacity, so that the slow down of the read-out speed and the decrease of reliability of read-out data of the static type RAM device having a large memory capacity is prevented.

9 Claims, 5 Drawing Figures

SEMICONDUCTOR RAM DEVICE

BACKGROUND OF THE INVENTION

(1) Field of the Invention

The present invention relates to a semiconductor RAM (Random Access Memory) device, more particularly to a static type RAM device which has a high read-out speed and a high reliability of read-out data.

(2) Description of the Prior Art

In recent years, the memory capacity and thus the integration, density of semiconductor memory devices has become very large. This is because it has become possible to make a great number of elements of very small size on one chip, due to recent technical developments in integrated circuitry. In a semiconductor memory device such as a static-type semiconductor RAM device having flip-flop type memory cells, the size of each of the memory cells has become very small so that the memory capacity has become very large.

However, in a conventional static type RAM device in which each of the memory cells drives a sense amplifier directly through bit lines and data bus lines, one disadvantage is that the read-out speed of the RAM device is decreased and the reliability of read-out data is decreased. This is due to the increase of the integration degree of the semiconductor memory device, where the chip size of each of the memory cells is small and, especially in a case of a static type memory cell, the size of the driver transistors included in each of the memory cells is small and hence the drive capacity of each of the memory cells decreases. Moreover, the stray capacitance of the bit lines and the data bus lines, which are driven by the memory cells and which form load circuits of the memory cells, does not decrease in accordance with the increase of the integration density of the RAM device. Therefore, the amplitude of a read-out signal from each of the memory cells becomes small, and the reliability of the read-out data is decreased. Thus, the time necessary to change the potential on each of the bit lines and the data bus lines becomes large, because it takes a long time to charge or discharge the stray capacitance of these lines by a memory cell having a small drive capacity. Therefore, the read-out time of the RAM device increases according to the increase in the integration density of the RAM device.

SUMMARY OF THE INVENTION

It is the principal object of the present invention to increase the read-out speed of the static RAM device having a large memory capacity.

It is another object of the present invention to improve the reliability of the read-out data from a static RAM device having a large memory capacity.

According to the present invention, there is provided a static type semiconductor RAM device comprising a latch circuit at every column which detects, amplifies and temporarily holds a read-out signal from each of the memory cells in the corresponding column and which has a large drive capacity. In the static type RAM device according to the present invention, each of the memory cells is used as an element to only hold information. The data bus lines are driven by the latch circuits having a large drive capacity, so that the slow down of the read-out speed of the static type RAM device having a large memory capacity is prevented.

DESCRIPTION OF THE PREFERRED EMBODIMENTS

Figure 1:
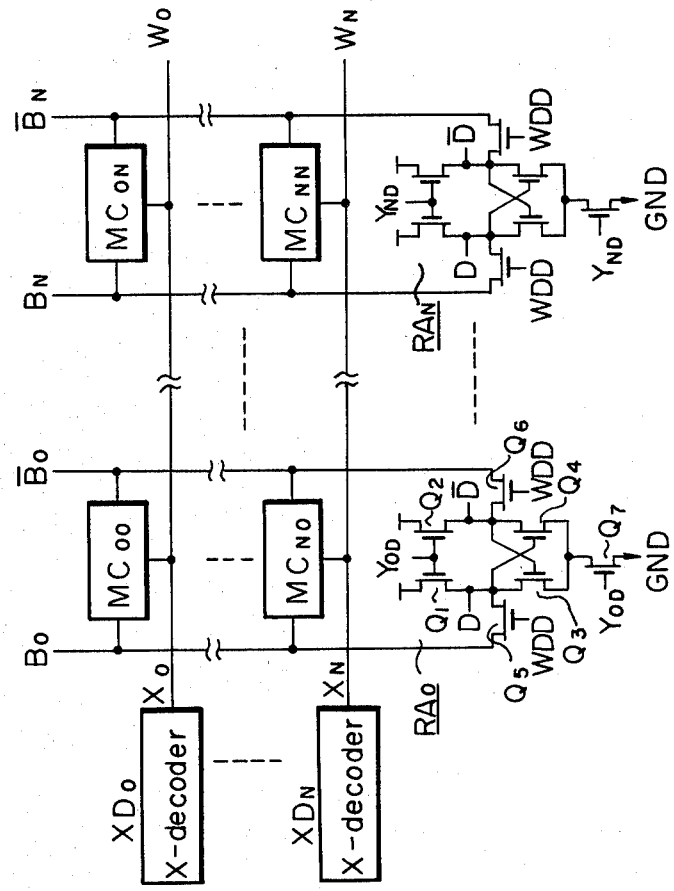
FIG. 1 is a block circuit diagram of a static type semiconductor RAM device according to the present invention.

FIG. 1 illustrates a static type semiconductor RAM device in accordance with an embodiment of the present invention. In FIG. 1, memory cells $MC_{00}$ through $MC_{NN}$ are disposed in a matrix of N rows by N columns and each of the memory cells comprises a flip-flop, which will be explained later in detail. Word lines $W_0$ through $W_N$ are connected to X address (or row address) decoders $XD_0$ through $XD_N$ respectively, and each of the word lines $W_0$ through $W_N$ is selected by corresponding one of the output signals $X_0$ through $X_N$ from the X address decoders $XD_0$ through $XD_N$. A plurality of bit line pairs $B_0$, $\overline{B}_0$ through $B_N$, $\overline{B}_N$ are crossed with a plurality of the word lines $W_0$ through $W_N$ to form the matrix. At each cross position of the matrix, each of the memory cells $MC_{00}$ through $MC_{NN}$ is connected between a bit line pair and a word line. These bit line pairs $\overline{B}_0$, $B_0$ through $B_N$, $\overline{B}_N$ are connected to latch circuits or amplifier circuits $RA_0$ through $RA_N$ respectively, according to the present invention. All the latch circuits $RA_0$ through $RA_N$ have the same structure, and therefore only the latch circuit $RA_0$ will be explained hereinafter. The latch circuit $RA_0$ comprises load transistors $Q_1$ and $Q_2$, and driver transistors $Q_3$ and $Q_4$ which comprise a flip-flop. The latch circuit $RA_0$ further comprises gate transistors $Q_5$ and $Q_6$ connected between the bit line pair $B_0$, $\overline{B}_0$ and the flip-flop, and a switching transistor $Q_7$. The switching transistor $Q_7$ and the load transistors $Q_1$ and $Q_2$ are turned on and off by a signal $Y_{0D}$ which is a delayed signal of an output signal $Y_0$ from a Y address (or column address) decoder, not shown in the drawing. The gate transistors $Q_5$ and $Q_6$ are turned on and off by a delayed gate signal WDD produced in a gate signal generator, which will be explained later. Therefore, the latch circuits $RA_0$ through $RA_N$ are selected by the delayed gate signal WDD and the delayed output signals $Y_{0D}$ through $Y_{ND}$ of the output signals $Y_0$ through $Y_N$ from the Y address decoders, not shown in the drawing. The flip-flop of each of the above-mentioned latch circuits $RA_0$ through $RA_N$ has the same structure as that of each of the memory cells $MC_{00}$ through $MC_{NN}$, which will be explained later. However, it should be noted that the drive capacity of the driver transistors $Q_3$ and $Q_4$ of each of the latch circuits is larger than that of the driver transistors of the flip-flop contained in each of the memory cells $MC_{00}$ through $MC_{NN}$. Therefore, for example, the size of the driver transistors $Q_3$ and $Q_4$ of each of the latch circuits is larger than that of the driver transistors of each of the memory cells $MC_{00}$ through $MC_{NN}$.

Figure 2:
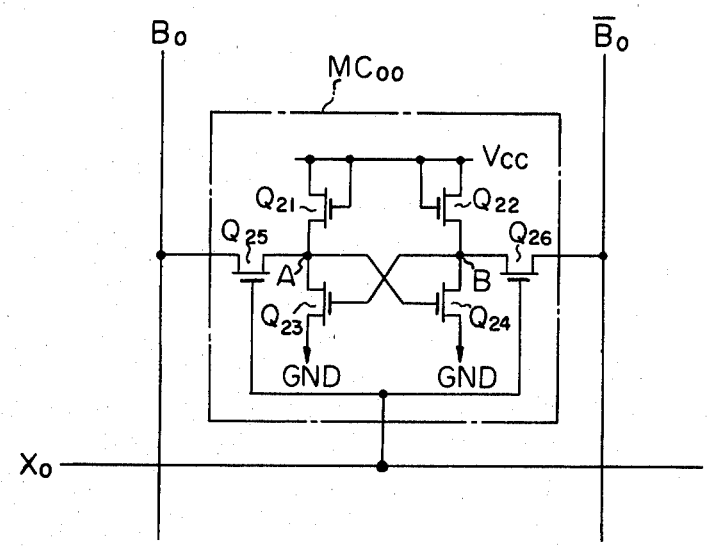
FIG. 2 is a circuit diagram of a memory cell used in the RAM device of FIG. 1.

FIG. 2 illustrates, as an example, the memory cell $MC_{00}$, used in the circuit of FIG. 1. The memory cell MC$_{00}$ comprises load transistors Q$_{21}$, Q$_{22}$ and driver transistors Q$_{23}$, Q$_{24}$ which comprise a flip-flop, and gate transistors Q$_{25}$, Q$_{26}$ which are turned on and off by for example, the output signal from the X address decoder XD$_0$, i.e., decoded address signal X$_0$. When a read-out or a write-in of information is effected, the gate transistors Q$_{25}$ and Q$_{26}$ are turned on due to the supply of a decoded address signal X$_0$ of high potential level, and thus transfer of information between the bit lines B$_0$, $\overline{B}_0$ and the flip-flop of the memory cell MC$_{00}$ is effected.

Figure 3:
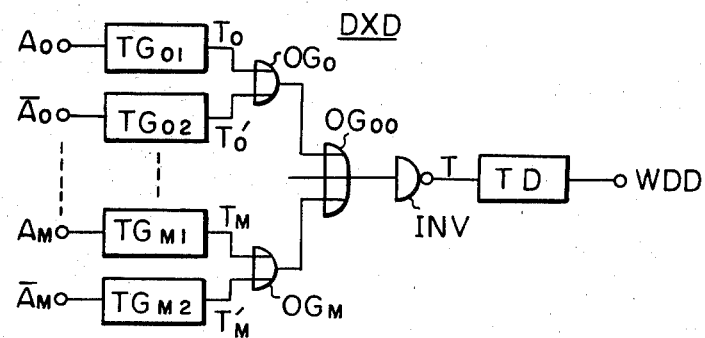
FIG. 3 is a block circuit diagram of a gate signal generator used in the RAM device of FIG. 1.

FIG. 3 illustrates a gate signal generator which produces a delayed gate signal WDD. This generator comprises a detector circuit DXD including trigger pulse generators TG$_{01}$, TG$_{02}$, ..., TG$_{M1}$, TG$_{M2}$, OR gates OG$_0$, ..., OG$_M$, OG$_{00}$ and an inverter INV, and, a delay circuit TD. Each of the trigger pulse generators TG$_{01}$ through TG$_{M2}$ detects potential changes, i.e. the leading edge or trailing edge, of the respective buffered address signals A$_0$, $\overline{A}_0$, ..., A$_M$, $\overline{A}_M$ and generates respective trigger pulses T$_0$, T$_0'$, ..., T$_M$, T$_M'$ when the potential change is detected. OR gates OG$_0$ through OG$_M$ and an OR gate OG$_{00}$ effect the logical "or" operation of the trigger pulses T$_0$, T$_0'$, ..., T$_M$, T$_M'$. The inverter INV inverts an output signal from the OR gate OG$_{00}$ and produces a gate signal T. A delay circuit TD delays the gate signal T for a predetermined time period and produces the delayed gate signal WDD, which was mentioned before. The delay time of the delay circuit TD is approximately the time it takes the output signal X$_0$, ..., X$_{N-1}$ or X$_N$ respectively to propagate from the X address decoder XD$_0$, ..., XD$_{N-1}$ or XD$_N$ to the farthest end of the word line W$_0$, ..., W$_{N-1}$ or W$_N$, i.e., a portion of the word line to which the memory cell MC$_{ON}$, ..., MC$_{N-1}$ N or MC$_{NN}$ is connected in the embodiment of FIG. 1. Therefore, the delay circuit TD can be constructed by using a dummy word line which has approximately the same length as that of each of the word lines W$_0$ through W$_N$ and which is disposed parallel to the word lines W$_0$ through W$_N$. In the above-mentioned detector circuit, each of the trigger pulse generators TG$_{01}$ through TG$_{M2}$ can be constructed by using, for example, a differentiation circuit and a wave shaping circuit.

Figure 4:
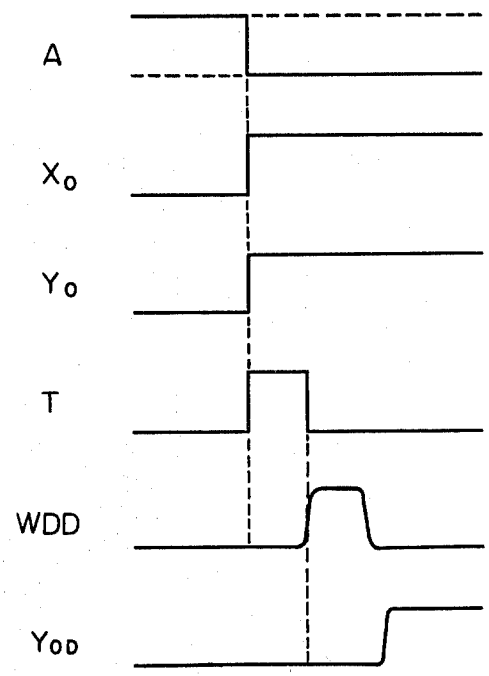
FIG. 4 is a timing diagram illustrating the signals appearing in the circuits of FIGS. 1 and 3.

With reference to FIG. 4, the operation of the memory device according to the present invention will now be explained. When the read-out of information from a memory cell of the memory device is effected, input address signals A$_0$, A$_1$, ..., A$_M$ designating the memory cell are applied to address buffer circuits, which are not shown in the drawings. The address buffer circuits produce buffered address signal pairs A$_0$, $\overline{A}_0$, ..., A$_M$, $\overline{A}_M$ containing non-inverted signals and inverted signals of the input address signals. Some of the address signals A$_0$, $\overline{A}_0$, ..., A$_M$, $\overline{A}_M$ are applied to the X address decorders XD$_0$ through XD$_N$ and some of the address signals are applied to Y address decoders, which are not shown in the drawings. When the memory cell, for example, MC$_{00}$ is selected, the output X$_0$ from the X address decoder XD$_0$ becomes high and the output Y$_0$ from the Y address decoder becomes high. Before the output X$_0$ and the output Y$_0$ become high, at least two of the address signal pairs A$_0$, $\overline{A}_0$, ..., A$_M$, $\overline{A}_M$ (i.e., at least a pair of the address signals including non-inverted and inverted address signals) change their potential level, as illustrated by A of FIG. 4. This change of the potential level may be a potential rise or a potential fall. In response to the change of the potential level of at least one address signal, the detector circuit DXD (FIG. 3) generates a gate signal T as illustrated in FIG. 4. The delay circuit TD (FIG. 3) delays the gate signal T and produces the delayed gate signal WDD, as illustrated in FIG. 4. The delayed gate signal WDD is applied to the gate electrodes of the transistors Q$_5$ and Q$_6$ of the latch circuits RA$_0$ through RA$_N$ of FIG. 1. Before the delayed gate signal WDD is generated, the potential of all portions of the selected word line W$_0$ rises to a high level. Therefore, the information from the memory cell MC$_{00}$, which is disposed at the position nearest the X address decoder XD$_0$ of FIG. 1, has already been read out to the bit line pair B$_0$, $\overline{B}_0$. That is, the potentials of the point A and the point B (FIG. 2) in the memory cell MC$_{00}$ are already transferred to the bit lines B$_0$ and $\overline{B}_0$ respectively. In such a condition, the gate transistors Q$_5$ and Q$_6$ are turned on by the delayed gate signal WDD and the information of the memory cell MC$_{00}$, i.e. the potentials of the point A and the point B of the memory cell MC$_{00}$, is applied to the latch circuit RA$_0$ through the gate transistors Q$_5$ and Q$_6$. After the delayed gate signal WDD is applied to the gate transistors Q$_5$ and Q$_6$, the delayed Y decoder signal Y$_{0D}$ is applied to the gate electrodes of the switching transistor Q$_7$ and of the load transistors Q$_1$ and Q$_2$ of the latch circuit R$_0$. Thus, the latch circuit RA$_0$ is activated due to the supply of an operating voltage. Therefore, the latch circuit RA$_0$ is set to a condition determined by the input potentials, i.e. the potentials of the bit lines B$_0$ and $\overline{B}_0$, so that the transferring of information to the latch circuit RA$_0$ is effected. In this case, stray capacitance existing between the input circuit portion of the latch circuit RA$_0$ and the ground are charged by the potentials of the bit lines B$_0$ and $\overline{B}_0$. Therefore, even if the delayed Y decoder signal Y$_{0D}$ is applied to the latch circuit RA$_0$ a short time after the delayed gate signal WDD has changed from high potential to low potential, as illustrated in FIG. 4, it is possible to set the latch circuit RA$_0$ to a condition determined by the potentials of the bit lines B$_0$ and $\overline{B}_0$. It should be noted that the delayed gate signal WDD and the delayed Y decoder signal Y$_{0D}$ are needed in order to prevent the destruction of data in the memory cell MC$_{00}$. If the gate transistors Q$_5$ and Q$_6$ are always turned on, due to the supply of DC voltage of high potential instead of the delayed gate signal WDD, or if the latch circuit RA$_0$ is activated by the Y decoder signal Y$_0$, instead of the delayed Y decoder signal Y$_{0D}$, the memory cell MC$_{00}$ having a small drive capacity is written-in by the potentials of the bit lines B$_0$ and $\overline{B}_0$ which are determined by a condition of the latch circuit RA$_0$ at the time the memory cell MC$_{00}$ is selected. Therefore, there is a possibility of the destruction of the data stored in the memory cell, for example, MC$_{00}$. In order to prevent the destruction of the data stored in each of the memory cells, it is necessary to use the delayed gate signal WDD and the delayed Y decoder signal Y$_{0D}$, as mentioned before, so that the potentials of the bit lines are determined by the selected memory cell and the latch circuit is set to the condition determined by the potentials of the bit lines due to the supplied potentials of the bit lines.

Figure 5:
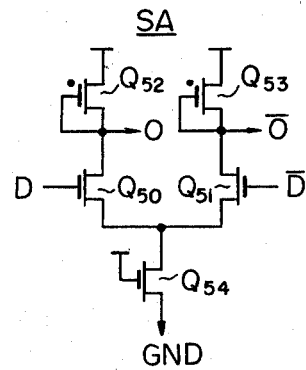
FIG. 5 is a circuit diagram of a sense amplifier used in the RAM device of FIG. 1.

FIG. 5 illustrates an example of a sense amplifier SA which is used in the memory device of FIG. 1. The sense amplifier SA comprises a pair of transistors Q$_{50}$ and Q$_{51}$ forming a differential amplifier, a pair of load transistors Q$_{52}$ and Q$_{53}$, and a transistor Q$_{54}$ forming a constant current source. The gate electrodes of the transistors Q$_{50}$ and Q$_{51}$ are respectively connected to the output terminals of the latch circuits RA$_0$ through RA$_N$ through data bus lines which are not shown in the drawings. Therefore, the output signals D and $\overline{D}$ of the latch circuit, for example, RA$_0$ are respectively applied to the gate electrodes of the transistors Q$_{50}$ and Q$_{51}$, and amplified by the sense amplifier SA. The sense amplifier SA provides output signals O and $\overline{O}$ as the read-out signals from the memory device.

According to the present invention, the bit lines, the data bus lines and the sense amplifier are driven by the latch circuits, whose driver transistors are big in size, so as to obtain a large drive capacity, to increase the read-out speed and to improve the reliability of the read-out data of the static type RAM device. Therefore, it is not necessary to use memory cells having big sizes. Also, a latch circuit is provided for every column so that the integration density of the RAM device is not greatly decreased.

I claim:

1. A semiconductor RAM device having a matrix of rows corresponding to word lines and columns corresponding to bit lines, and static type memory cells, respective of the static type memory cells operatively connected at corresponding of the cross points of said matrix,
   a row decoder having outputs respectively, operatively connected to corresponding ones of said rows;
   a column decoder having outputs respectively, operatively connected to corresponding ones of said columns;
   each of said static type memory cells being selected by the respective output from the row decoder and the respective output from the column decoder and generating a data signal in response to being selected, said semiconductor RAM device comprising:
   amplifier circuits, having activated and non-activated states, respective of said amplifier circuits operatively connected to corresponding of said bit lines, for amplifying the data signal from a selected one of said static type memory cells associated with said corresponding bit lines, and
   gate circuits having activated and non-activated states, respective of said gate circuits operatively connected between said corresponding bit lines and said respective amplifier circuits, said gate circuits being activated for a first specified period after a respective memory cell is selected by said output from said row decoder and said output from said column decoder and passing the data signal from said respective memory cell to said corresponding amplifier circuit,
   said amplifier circuit being selectively activated for a second specified period after said first specified period.

2. A semiconductor RAM device as set forth in claim 1, wherein said semiconductor RAM device further comprises:
   a detector circuit, operatively connected to corresponding of said gate circuits, for receiving input address signals and for detecting a potential change of at least one of the input address signals, and for providing a gate signal in response to said detecting; and
   a delay circuit, operatively connected between said detector circuit and said corresponding of said gate circuits, for delaying said gate signal from said detector circuit, for providing an output signal and for activating said gate circuits.

3. A semiconductor RAM device as set forth in claim 2, wherein said delay circuit delays said gate signal for a time approximately equal to the time for said output signal from said row decoder to propagate from said row decoder to the memory cell connected at the end of a word line farthest from said row decoder.

4. A semiconductor RAM device as set forth in claim 3, wherein said amplifier circuits are activated in response to said output signal from said column decoder.

5. A semiconductor RAM device as set forth in claim 2, wherein said amplifier circuits are activated in response to said output signal from said column decoder.

6. A semiconductor RAM device as set forth in claims 1, 2, 3, 5 or 4, wherein said amplifier circuits comprise latch circuits, each latch circuit including a pair of driver transistors.

7. A semiconductor RAM device as set forth in claim 6, wherein each memory cell includes a driver transistor having a drive capacity, and wherein each of said driver transistors of said latch circuits has a larger drive capacity than the drive capacity of said driver transistors of the memory cells.

8. A semiconductor RAM device as set forth in claim 7, wherein each memory cell driver transistor has a predetermined size, and each of said driver transistors of said latch circuits has a bigger size than said predetermined size of said driver transistors of the memory cells.

9. A semiconductor RAM device as set forth in claim 7, wherein said drive capacity of said memory cell driver transistors is selected to drive only said respective column and said respective gate circuit.

* * * * *

UNITED STATES PATENT AND TRADEMARK OFFICE
CERTIFICATE OF CORRECTION

PATENT NO. : 4,400,800

DATED : August 23, 1983

INVENTOR(S) : KURAFUJI

It is certified that error appears in the above-identified patent and that said Letters Patent is hereby corrected as shown below:

Column 3, line 34, "$MC_{N-1}N$" should be --$MC_{N-1}N_5$--;
Column 6, line 33, "$5_{or}^{N}4$" should be --$4_{or}^{N}5$--.

Signed and Sealed this

Seventeenth Day of December 1985

[SEAL]

Attest:

DONALD J. QUIGG

Attesting Officer

Commissioner of Patents and Trademarks